(12) United States Patent
Yu et al.

(10) Patent No.: US 10,790,210 B2
(45) Date of Patent: Sep. 29, 2020

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Chi-Yang Yu, Taoyuan (TW); Chien-Hsun Lee, Hsin-chu County (TW); Yu-Min Liang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/171,326

(22) Filed: Oct. 25, 2018

(65) Prior Publication Data

US 2020/0043819 A1 Feb. 6, 2020

Related U.S. Application Data

(60) Provisional application No. 62/712,238, filed on Jul. 31, 2018.

(51) Int. Cl.
| | |
|---|---|
| *H01L 21/44* | (2006.01) |
| *H01L 23/24* | (2006.01) |
| *H01L 23/00* | (2006.01) |
| *H01L 23/433* | (2006.01) |
| *H01L 23/31* | (2006.01) |
| *H01L 25/065* | (2006.01) |
| *H01L 21/56* | (2006.01) |

(52) U.S. Cl.
CPC .......... *H01L 23/24* (2013.01); *H01L 23/3185* (2013.01); *H01L 23/433* (2013.01); *H01L 24/02* (2013.01); *H01L 24/13* (2013.01); *H01L 24/24* (2013.01); *H01L 24/25* (2013.01); *H01L 25/0655* (2013.01); *H01L 21/568* (2013.01); *H01L 2224/02235* (2013.01); *H01L 2224/02331* (2013.01); *H01L 2224/02379* (2013.01); *H01L 2224/02381* (2013.01); *H01L 2224/13024* (2013.01); *H01L 2224/24137* (2013.01); *H01L 2224/24998* (2013.01); *H01L 2224/25171* (2013.01)

(58) Field of Classification Search
CPC ... H01L 23/24; H01L 23/3185; H01L 23/433; H01L 24/02; H01L 24/13; H01L 24/24; H01L 24/25; H01L 25/0655
USPC ....................................................... 438/613
See application file for complete search history.

(56) References Cited

U.S. PATENT DOCUMENTS 8,080,122 B2 * 12/2011 Sunohara ............ H01L 21/4857
156/247
8,779,599 B2 * 7/2014 Lin ...................... H01L 25/0652
257/685

(Continued)

*Primary Examiner* — Luan C Thai
(74) *Attorney, Agent, or Firm* — JCIPRNET (57) ABSTRACT

A semiconductor package and a manufacturing method are provided. The semiconductor package includes a die, a dummy cube, a stress relaxation layer, an encapsulant and a redistribution structure. The dummy cube is disposed beside the die. The stress relaxation layer covers a top surface of the dummy cube. The encapsulant encapsulates the die and the dummy cube. The redistribution structure is disposed over the encapsulant and is electrically connected to the die. The stress relaxation layer is interposed between the dummy cube and the redistribution structure.

20 Claims, 11 Drawing Sheets

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,224,697 B1 * | 12/2015 | Kwon .................. H01L 23/562 |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,613,931 B2 * | 4/2017 | Lin ..................... H01L 25/0652 |
| 9,922,964 B1 * | 3/2018 | Chen .................... H01L 25/105 |
| 10,043,769 B2 * | 8/2018 | Shih ........................ H01L 24/02 |
| 10,312,221 B1 * | 6/2019 | Agarwal ............ H01L 25/0657 |

\* cited by examiner

SEMICONDUCTOR PACKAGE AND MANUFACTURING METHOD THEREOF

CROSS-REFERENCE TO RELATED APPLICATION

This application claims the priority benefits of U.S. provisional application Ser. No. 62/712,238, filed on Jul. 31, 2018. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured from a single semiconductor wafer. The dies of the wafer may be processed and packaged with other semiconductor devices or dies at the wafer level, and various technologies have been developed for wafer level packaging. In addition, for multi-die packages, the arrangement of the dies and the corresponding connecting elements affects data transmission speed among semiconductor dies and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure describe the exemplary manufacturing process of package structures and the package structures fabricated there-from. Certain embodiments of the present disclosure are related to the package structures formed with a stress dissipating structure. The wafers or dies may include one or more types of integrated circuits or electrical components on a bulk semiconductor substrate or a silicon/germanium-on-insulator substrate. The embodiments are intended to provide further explanations but are not to be used to limit the scope of the present disclosure.

Figure 1A:
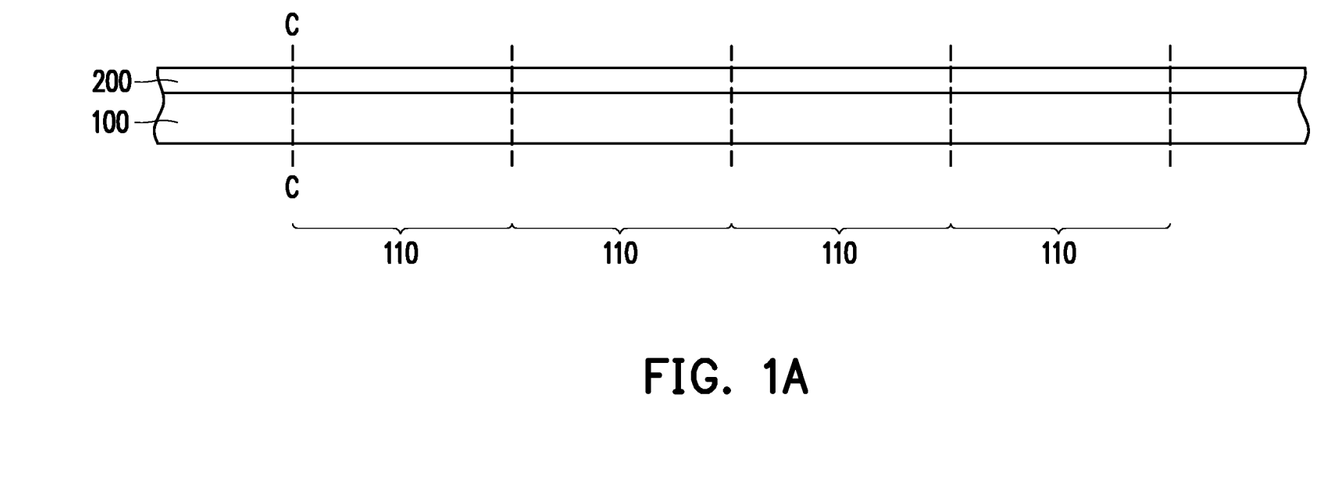
FIG. 1A through FIG. 1B show schematic cross-sectional views of structures produced at various stages of a manufacturing method of a dummy cube according to some embodiments of the present disclosure.
Figure 1B:
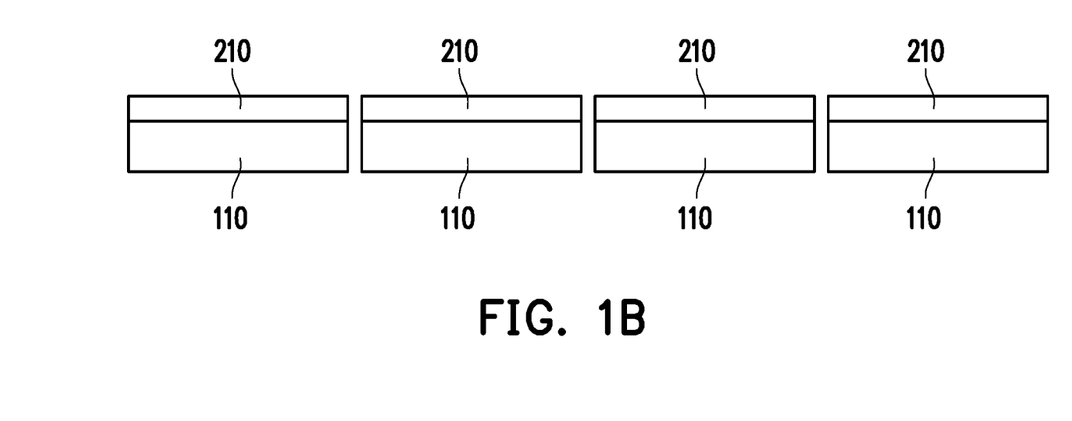

FIG. 1A through FIG. 1B show schematic cross-sectional views illustrating structures produced at various stages of a manufacturing method of dummy cubes 110 shown in FIG. 1B according to some embodiments of the disclosure. Referring to FIG. 1A, a wafer 100 is provided. In some embodiments, the material of the wafer 100 includes semiconductor materials, such as semiconductor materials of the groups III-V of the periodic table. In some alternative embodiments, the material of the wafer 100 may include an inorganic material. In some embodiments, the inorganic material includes a metal such as copper or copper alloys, aluminum or aluminum alloys, or a combination thereof. In some embodiments, the inorganic material includes a ceramic material. In some embodiments, the inorganic material includes a glass material containing silicon oxide.

As shown in FIG. 1A, in some embodiments, a polymer material layer 200 is formed on the wafer 100. In some embodiments, the polymer material layer 200 includes polyimide, epoxy resin, acrylic resin, phenol resin, benzocyclobutene (BCB), polybenzooxazole (PBO), or any other suitable polymer-based dielectric material. In some embodiments, the polymer material layer 200 includes polyimide, polybenzooxazole (PBO), or a combination thereof. The polymer material layer 200, for example, may be formed by suitable fabrication techniques such as spin-on coating, chemical vapor deposition (CVD), plasma-enhanced chemical vapor deposition (PECVD), or the like. In some embodiments, the polymer material layer 200 is formed by spin coating a polymeric material (not shown) on the wafer 100. In some embodiments, a curing process may be performed to form the polymer material layer 200 after spin coating the polymeric material. In some alternative embodiments, the polymer material layer 200 may comprise a plurality of polymeric layers (not shown). In some embodiments, a material of a first polymeric layer (not shown) of the plurality of polymeric layers may be different from a material of an adjacent polymeric layer of the plurality of polymeric layers. In some embodiments, different polymeric layers of the plurality of polymeric layers may include the same material. In some alternative embodiments, formation of the polymer material layer 200 may be skipped, and the dicing process described below may be performed on the wafer 100.

Referring to FIG. 1A and to FIG. 1B, in some embodiments, the wafer 100, optionally with the polymer material layer 200 formed thereon, is diced along the cut lines CC shown in FIG. 1A to produce a plurality of dummy cubes 110. In some embodiments, each dummy cube 110 of the plurality of dummy cubes 110 has a polymeric layer 210 formed thereon. In some embodiments, the polymeric layer 210 may be formed from the polymer material layer 200. As shown in FIG. 1A, in some embodiments, adjacent dummy cubes 110 may be separated by cutting the wafer 100 and the optionally formed polymer material layer 200 along the cut lines CC. In some embodiments, the singulation process typically involves performing a wafer dicing process with a rotating blade and/or a laser beam.

Figure 2A:
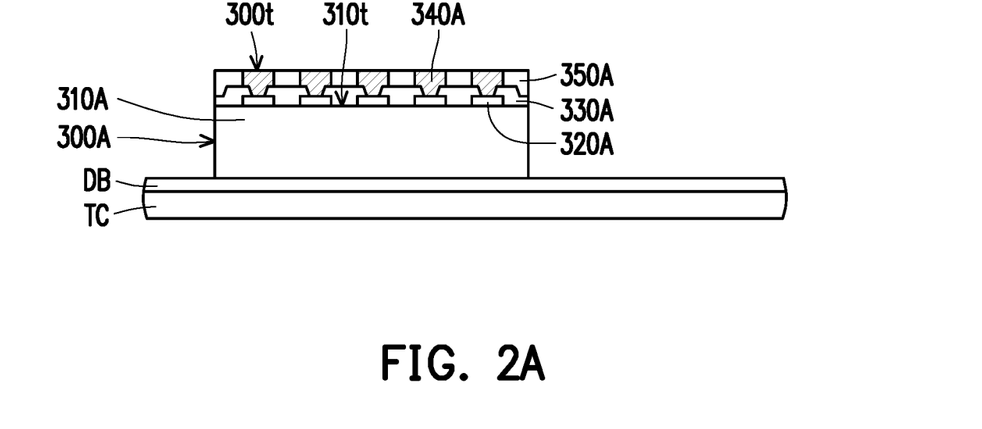
FIG. 2A through FIG. 2G show schematic cross-sectional views of structures produced at various stages of a manufacturing method of a semiconductor package according to some embodiments of the present disclosure.

FIG. 2A through FIG. 2G show schematic cross-sectional views illustrating structures produced at various stages of a manufacturing method of a semiconductor package 10 (shown in FIG. 2G) according to some embodiments of the disclosure. Referring to FIG. 2A, a temporary carrier TC having a de-bonding layer DB formed thereon is provided. In some embodiments, the temporary carrier TC is a glass substrate, a metal plate, a plastic supporting board or the like, but other suitable substrate materials may be used as long as the materials are able to withstand the subsequent steps of the process. In some embodiments, the de-bonding layer DB includes a light-to-heat conversion (LTHC) release layer, which facilitates peeling the temporary carrier TC away from the semiconductor package when required by the manufacturing process.

Figure 3:
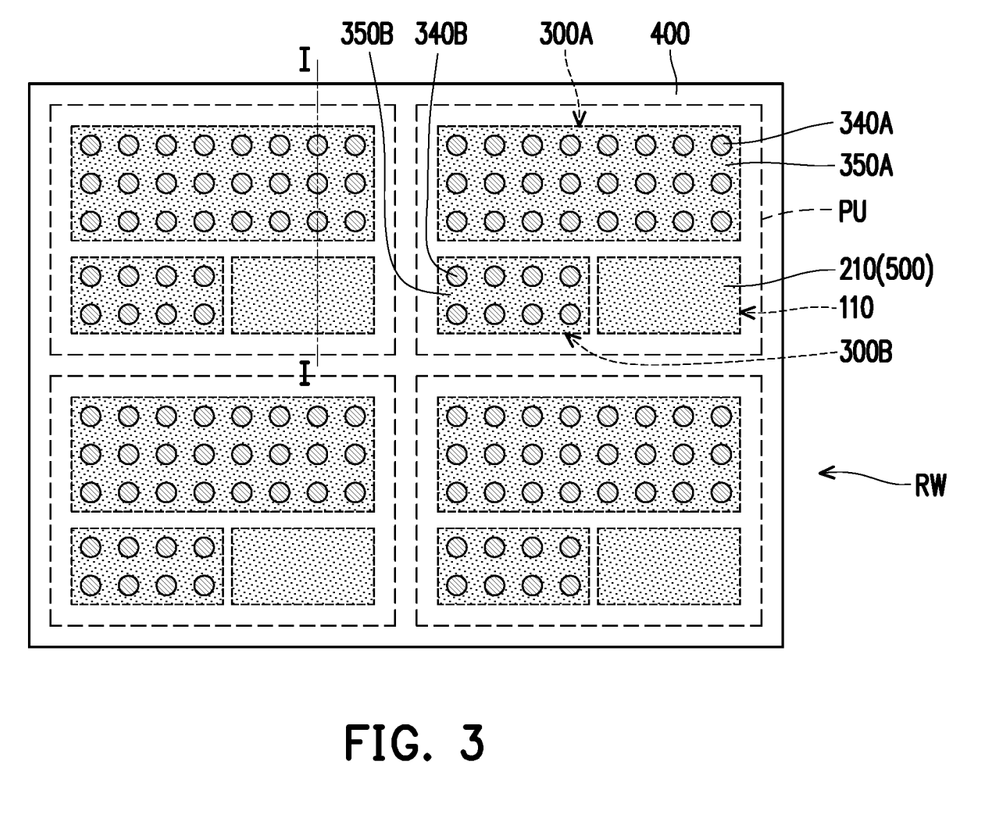
FIG. 3 shows a schematic top view of a manufacturing intermediate of semiconductor packages according to some embodiments of the present disclosure.

In some embodiments, referring to FIG. 2A, a semiconductor die 300A is provided on the temporary carrier TC. In some embodiments, the semiconductor die 300A is placed onto the temporary carrier TC through a pick-and-place method. Even though only one semiconductor die 300A is presented in FIG. 2A for illustrative purposes, it is understood that a semiconductor package according to some embodiments of the disclosure may contain one or more than one semiconductor die 300A. Furthermore, a plurality of semiconductor dies may be provided on the temporary carrier TC to produce multiple package units PU (as shown in FIG. 3) with wafer-level packaging technology. As shown in FIG. 3, each package unit PU may include more than one semiconductor die. For example, each of the package units PU shown in FIG. 3 includes two semiconductor dies 300A and 300B. It should be noted that as the cross-sectional views are taken along the line I-I shown in FIG. 3 (and at corresponding places for the structures of FIG. 5 and FIG. 7), only the semiconductor package 300A is illustrated in the cross-sectional views of the present disclosure.

Referring back to FIG. 2A, in some embodiments, the semiconductor dies 300A includes a semiconductor substrate 310A, a plurality of contact pads 320A and a passivation layer 330A. The contact pads 320A may be formed on a top surface 310t of the semiconductor substrate 310A. The passivation layer 330A may cover the top surface 310t and have a plurality of openings that exposes at least a portion of each contact pad 320A. In some embodiments, the semiconductor die 300A may further include a plurality of conductive posts 340A filling the openings of the passivation layer 330A and electrically connected to the contact pads 320A, and a protective layer 350A surrounding the conductive posts 340A. In some embodiments, the semiconductor die 300A is placed on the temporary carrier TC with an active surface 300t of the semiconductor die 300A facing away from the temporary carrier TC.

In some embodiments, the semiconductor substrate 310A shown may be made of semiconductor materials, such as semiconductor materials of the groups III-V of the periodic table. In some embodiments, the semiconductor substrate 310A includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 310A includes active components (e.g., transistors or the like) and optionally passive components (e.g., resistors, capacitors, inductors, or the like) formed therein. In certain embodiments, the contact pads 320A include aluminum pads, copper pads, or other suitable metal pads. In some embodiments, the passivation layer 330A may be a single layer or a multi-layered structure, including a silicon oxide layer, a silicon nitride layer, a silicon oxy-nitride layer, a dielectric layer formed by other suitable dielectric materials or combinations thereof. In some embodiments, the material of the conductive posts 340A includes copper, copper alloys, or other conductive materials, and may be formed by deposition, plating, or other suitable techniques. In some embodiments, similar structural features as the ones just discussed for the semiconductor die 300A may be found in the other semiconductor dies of the package unit PU being formed (for example, in the semiconductor 300B shown in FIG. 3).

Each of the semiconductor dies 300A, 300B may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor dies 300A, 300B, either one or both, include a memory die such as a high bandwidth memory die. In some embodiments, the semiconductor dies 300A, 300B may be the same type of dies or perform the same functions. In some embodiments, the semiconductor dies 300A, 300B may be different types of dies or perform different functions. The disclosure is not limited by the type of dies used for the semiconductor dies 300A, 300B.

Figure 2B:
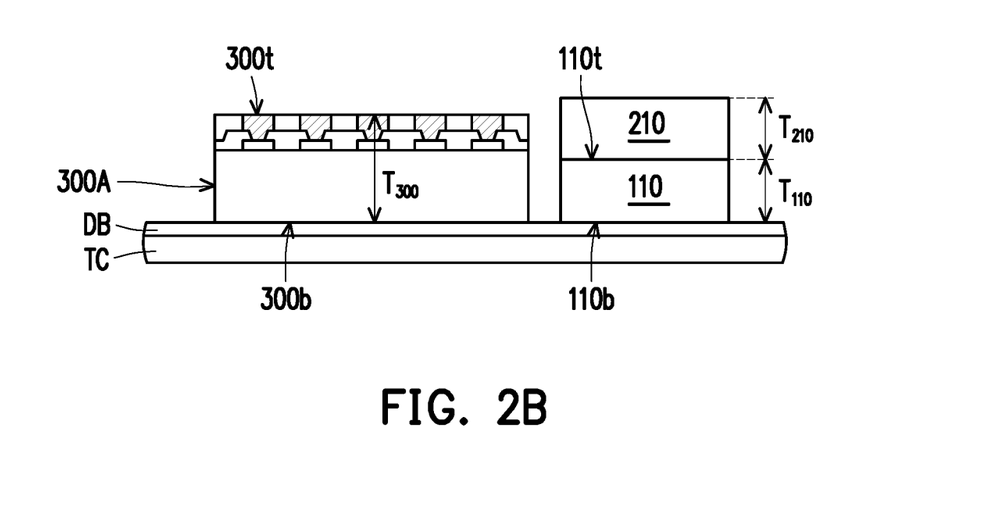

In some embodiments, as shown in FIG. 2B, a dummy cube 110 is disposed beside the semiconductor die 300A on the temporary carrier TC. In some embodiments, the dummy cube 110 has a polymeric layer 210 formed on a top surface 110t. In some embodiments, the dummy cube 110 is disposed on the temporary carrier TC with the top surface 110t where the polymeric layer 210 is formed further away from the temporary carrier TC. In some embodiments, the polymeric layer 210 comprises a plurality of polymeric layers. In some alternative embodiments, the dummy cube 110 does not have a polymeric layer 210 formed thereon, and the top surface 110t is exposed. In some embodiments, the dummy cube 110 and the polymeric layer 210 are produced according to the process previously described with reference to FIG. 1A and FIG. 1B, but the disclosure is not limited thereto. In some alternative embodiments, the dummy cube 110 may be provided according to other suitable processes.

A thickness $T_{300}$ of the semiconductor die 300A is measured between the active surface 300t and an opposite bottom surface 300b of the semiconductor die 300A. In some embodiments, the thickness $T_{300}$ is greater than a thickness $T_{110}$ of the dummy cube 110, where the thickness $T_{110}$ of the dummy cube is measured between the top surface 110t and a bottom surface 110b opposite to the top surface 110t. In some embodiments, as shown in FIG. 2B, the thickness $T_{300}$ of the semiconductor die 300A is less than a combination of the thickness $T_{110}$ of the dummy cube 110 and a thickness $T_{210}$ of the polymeric layer 210, but the disclosure is not limited thereto. In some alternative embodiments, the combination of the thicknesses $T_{110}$ and $T_{210}$ is equal to the thickness $T_{300}$ of the semiconductor die 300A. In some alternative embodiments, the combination of the thicknesses $T_{110}$ and $T_{210}$ is less than the thickness $T_{300}$ of the semiconductor die 300A.

Figure 2C:
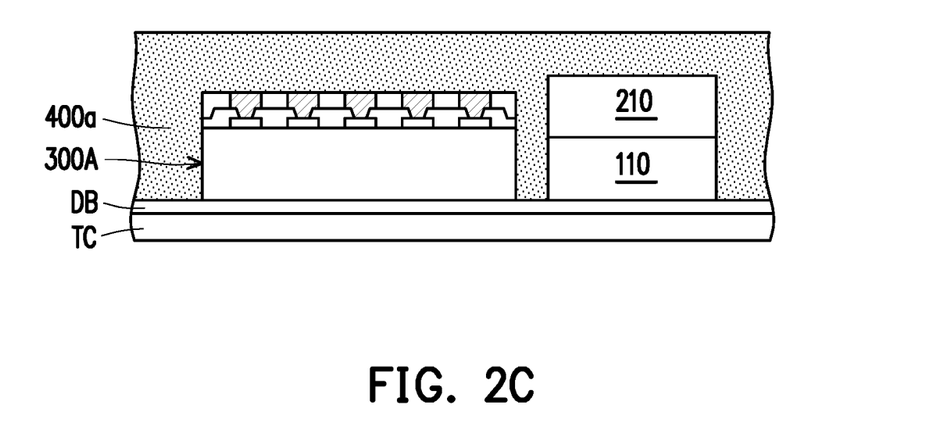

Referring to FIG. 2C, an encapsulating material 400a is formed over the temporary carrier TC to at least encapsulate the semiconductor dies 300A, 300B, the dummy cube 110 and the polymeric layer 210. In some embodiments, not only the semiconductor dies 300A, 300B but also the polymeric layer 210 is fully covered and not revealed by the encapsulating material 400a. In some embodiments, the encapsulating material 400a may be a molding compound, a molding underfill, a resin (such as an epoxy resin), or the like. In some embodiments, the encapsulating material 400a is formed by an over-molding process. In some embodiments, the encapsulating material 400a is formed by a compression molding process.

Figure 2D:
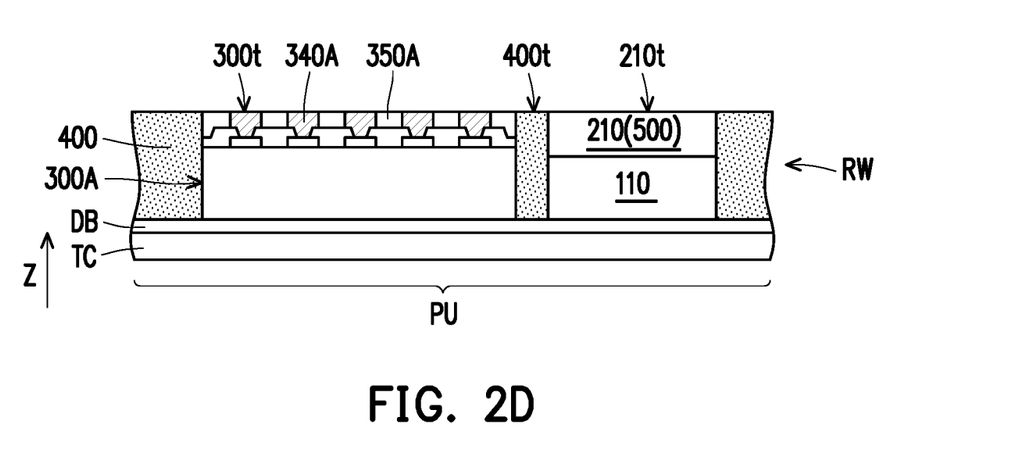

FIG. 3 is a schematic top view of the manufacturing intermediate shown in FIG. 2D. Referring to FIG. 2C, FIG. 2D and FIG. 3, in some embodiments, the encapsulating material 400a is partially removed by a planarization process until the conductive posts 340A, 340B of the semiconductor dies 300A, 300B are exposed. That is, the active surfaces 300t of the semiconductor dies 300A, 300B are exposed. In some embodiments, portions of the conductive posts 340A, 340B and of the protective layers 350A, 350B of the semiconductor dies 300A, 300B may be removed during the planarization step. In some embodiments, portions of the polymeric layer 210 may be removed during the planarization step. Planarization of the encapsulating material 400a may produce an encapsulant 400 that surrounds the dummy cube 110 and the semiconductor dies 300A, 300B. The active surfaces 300t of the semiconductor dies 300A, 300B and a top surface 210t of the polymeric layer 210 are coplanar with a top surface 400t of the encapsulant 400. In some embodiments, the planarization of the encapsulating material 400a includes performing a mechanical grinding process and/or a chemical mechanical polishing (CMP) process. As shown in FIG. 3, viewing the manufacturing intermediate of FIG. 2D from the top along a vertical direction (the direction Z in FIG. 2D), the encapsulant 400 may reveal the conductive posts 340A, 340B and the protective layer 350A, 350E of each of the semiconductor dies 300A, 300B, as well as the polymeric layer 210 disposed on top of the dummy cube 110. In some embodiments, a span of the polymeric layer 210 matches a span of the dummy cube 110.

With the formation of the encapsulant 400, a reconstructed wafer RW is obtained. In some embodiments, the reconstructed wafer RW includes a plurality of package units PU. In the cross-sectional view of FIG. 2D, a single package unit PU is shown for simplicity. In other words, the exemplary process may be performed at a reconstructed wafer level, so that multiple package units PU are processed in the form of the reconstructed wafer RW. According to FIG. 3, four package units PU are shown in the reconstructed wafer RW, but, of course, this is for illustrative purposes only, and the disclosure is not limited by the number of package units PU being produced in the reconstructed wafer RW. In FIG. 3, the outlined areas labeled as 300A and 300B corresponds to the position of the semiconductor dies 300A and 300B, respectively, within each of the package units PU. Similarly, the outlined areas labeled as 110 correspond to the positions of the dummy cube 110. In some embodiments, sizes of the semiconductor dies 300A and 300B within a same package unit PU differs from each other. As shown in FIG. 3, in some embodiments, a difference in size between the semiconductor die 300A and the semiconductor die 300B may be such that, were the dummy cube 110 not included, extensive portions of the package unit PU would be filled by the sole encapsulant 400. In some embodiments, the presence in the package unit PU of the dummy cube 110 in regions that would otherwise be filled by the sole encapsulant 400 may reduce warpage of the package units PU or of the finished semiconductor packages during subsequent process steps. In some embodiments, a material of the dummy cube 110 may include a semiconductor material. In some alternative embodiments, the material of the dummy cube 110 may include an inorganic material. In some embodiments, the inorganic material includes a metal such as copper or copper alloys, aluminum or aluminum alloys, or combination thereof. When the dummy cube 110 is made of metal, the dummy cube 110 may contribute to dissipate the heat produced during operation of the semiconductor package 10. In some embodiments, the inorganic material includes a ceramic material. In some embodiments, the inorganic material includes a glass material containing silicon oxide. In some embodiments, a material of the polymeric layer 210 may include polyimide, polybenzooxazole, or a combination thereof, but the disclosure is not limited thereto. In some embodiments, a material of the polymeric layer 210 may be chosen in function of the material used for the dummy cube 110, for example to improve a matching of the coefficients of thermal expansion between the dummy cube and the encapsulant 400.

In some embodiments, different materials behave differently during the planarization process. For example, a first material (such as the material of the encapsulating material 400a) that is subjected to the planarization process may be removed faster (or slower) than another material undergoing the same planarization process. In some embodiments, the different behavior of different materials during the planarization process may generate some stress within the package unit PU. In some cases, the presence of the polymeric layer 210 may help to evenly distribute or relieve the stress generated during the planarization process, so that issues such as delamination between the dummy cube 110 and the encapsulant 400 or cracking of the encapsulant 400 are less likely to occur during the planarization process. In other words, the polymeric layer 210 acts as a stress relaxation layer 500. By including the stress relaxation layer 500 on top of the dummy cube 110, a failure rate of the produced semiconductor packages may be reduced, thus increasing the overall process yields and reducing the manufacturing cost per package.

Figure 2E:
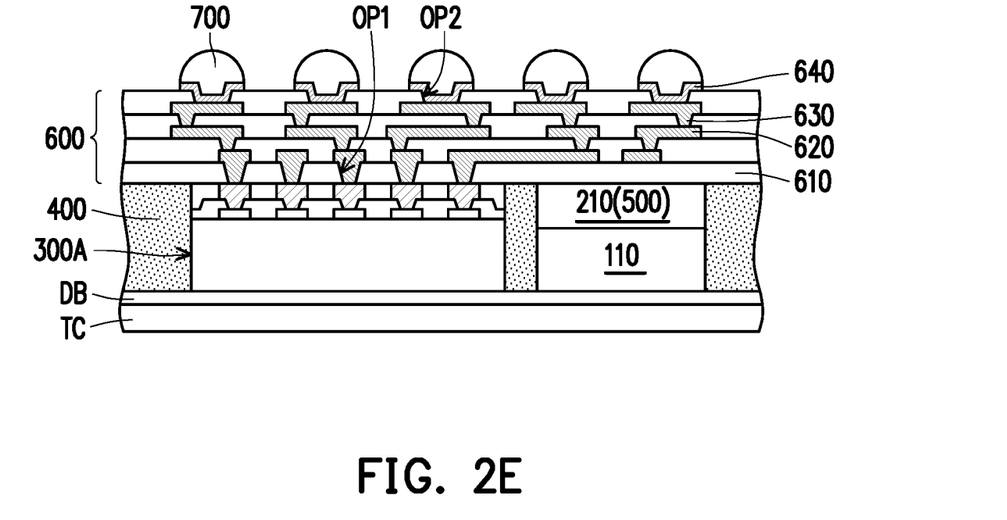

Referring to FIG. 2E, a redistribution structure 600 is formed over the semiconductor dies 300A, 300B (300B is shown in FIG. 3), the encapsulant 400, and the stress relaxation layer 500. In some embodiments, the redistribution structure 600 includes at least one dielectric layer 610 and at least one redistribution conductive layer 620. Each redistribution conductive layer 620 may be constituted by a plurality of redistribution conductive patterns. In the redistribution structure 600, a redistribution conductive layer 620 is sandwiched between two adjacent dielectric layers 610. In some embodiments, a material of the redistribution conductive layers 620 includes aluminum, titanium, copper, nickel, tungsten, and/or alloys thereof. The redistribution conductive layers 620 may be formed by, for example, electroplating, deposition, and/or photolithography and etching. In some embodiments, a material of the dielectric layers 610 includes polyimide, epoxy resin, acrylic resin, phenol resin, benzocyclobutene (BCB), polybenzooxazole (PBO), or any other suitable polymer-based dielectric material. The dielectric layers 610, for example, may be formed by suitable fabrication techniques such as spin-on coating, chemical vapor deposition (CVD), plasma-enhanced chemical vapor deposition (PECVD), or the like. It should be noted that the number of redistribution conductive layers 620 and the number of dielectric layers 610 illustrated in FIG. 2E are merely for illustrative purposes, and the disclosure is not limited thereto. In some alternative embodiments, more or fewer dielectric layers 610 and more or fewer redistribution conductive layers 620 may be formed depending on the circuit design. As shown in FIG. 2E, when the redistribution structure 600 includes multiple redistribution conductive layers 620 and multiple dielectric layers 610, these redistribution conductive layers 620 and these dielectric layers 610 are stacked alternately, and the redistribution conductive layers 620 may be interconnected with one another by conductive vias 630 embedded in the dielectric layers 610.

In some embodiments, the bottommost of the dielectric layers 610 has a plurality of openings OP1 filled by some of the conductive vias 630. The bottommost conductive vias 630 contacts the conductive posts 340A, 340B of the semiconductor dies 300A, 300B, thus establishing electrical connection between the semiconductor dies 300A, 300B and the redistribution structure 600. In some embodiments, the semiconductor dies 300A and 300B are electrically connected through the redistribution structure 600.

Referring to FIG. 2E, the topmost of the dielectric layers 610 presents a second plurality of openings OP2 exposing the topmost of the redistribution conductive layers 620. In some embodiments, a plurality of connective terminals 700 contacts the topmost conductive layer 620 of the redistribution structure 600 through the openings OP2, in such a way that the connective terminals 700 are electrically connected with the redistribution structure 600. In some embodiments, a plurality of under bump metallurgies 640 may be provided between the conductive terminals 700 and the topmost conductive layer 620 for better adhesion and connection reliability. The under bump metallurgies 640 may be conformally formed in the openings OP2, and further extend on portions of the topmost dielectric layer 610 at the sides the openings OP2. In some embodiments, the connective terminals 700 include ball grid array (BGA) balls or solder balls. In some embodiments, the connective terminals 700 may be placed on the under-bump metallurgies 640 through a ball placement process.

Figure 2F:
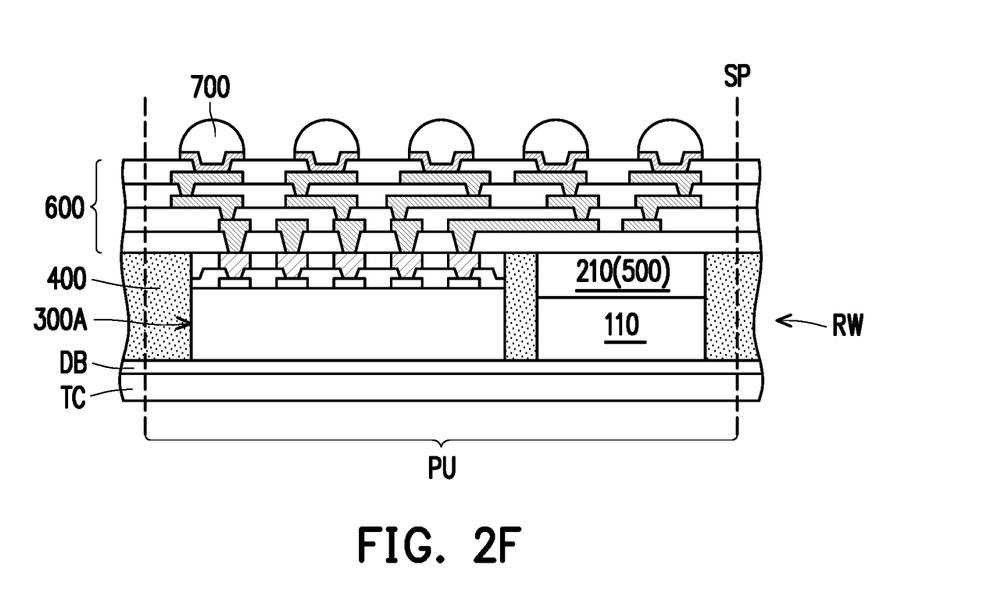
Figure 2G:
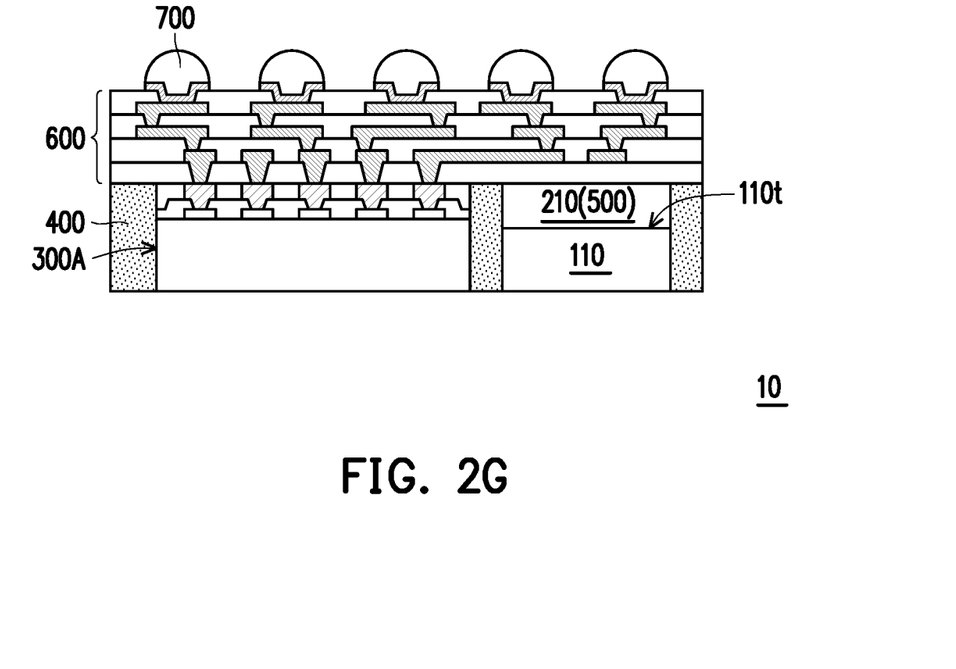

In some embodiments, as shown in FIG. 2F and FIG. 2G, a singulation step is performed to separate the individual semiconductor packages 10, for example, by cutting through the reconstructed wafer RW along the scribing lanes SP arranged between individual package units PU. In some embodiments adjacent packages 10 may be separated by cutting through the scribing lanes SP of the reconstructed wafer RW. In some embodiments, the singulation process typically involves performing a wafer dicing process with a rotating blade and/or a laser beam. In some embodiments, the de-bonding layer DB (e.g., the LTHC release layer) is irradiated with a UV laser so that the carrier TC and the de-bonding layer DB are easily peeled off from the semiconductor packages 10. Nevertheless, the de-bonding process is not limited thereto, and other suitable de-bonding methods may be used in some alternative embodiments.

After the singulation step and removal of the temporary carrier TC, a plurality of semiconductor packages 10 are obtained. An exemplary cross-sectional view of the semiconductor package 10 according to some embodiments of the disclosure is illustrated in FIG. 2G. Based on the above, the semiconductor package 10 includes the semiconductor dies 300A, 300B, the dummy cube 110, the polymeric layer 210, the encapsulant 400, the redistribution structure 600, and the connective terminals 700. The semiconductor dies 300A and 300B are electrically connected to the redistribution structure 600. In some embodiments, no electrical connection is established between the dummy cube 110 and the redistribution structure 600. The semiconductor dies 300A, 300B, the dummy cube 110 and the polymeric layer 210 are embedded in the encapsulant 400. In some embodiments, the polymeric layer 210 is disposed between the dummy cube 110 and the redistribution structure 600. In some embodiments, the polymeric layer 210 extends from a top surface 110t of the dummy cube 110 until the redistribution structure 600. In some embodiments, the connective terminals 700 are disposed on the redistribution structure 600 for electrically connecting the semiconductor package 10 with other electronic devices (not shown). In some embodiments, because the dummy cube 110 is embedded in the encapsulant 400, the semiconductor package 10 may have a lower tendency to undergo warpage or other deformations when subjected to thermal stress. Furthermore, as the polymeric layer 210 acts as a stress relaxation layer 500, stress generated during a planarization process to form the encapsulant 400 is attenuated or dispersed more efficiently, so that delamination between the dummy cube 110 and the encapsulant 400 or cracking of the encapsulant 400 are less likely to occur. In other words, by including the stress relaxation layer 500 on top of the dummy cube 110, a failure rate of the semiconductor package 10 may be reduced, thus increasing the overall process yields and reducing the manufacturing cost per package.

Figure 2H:
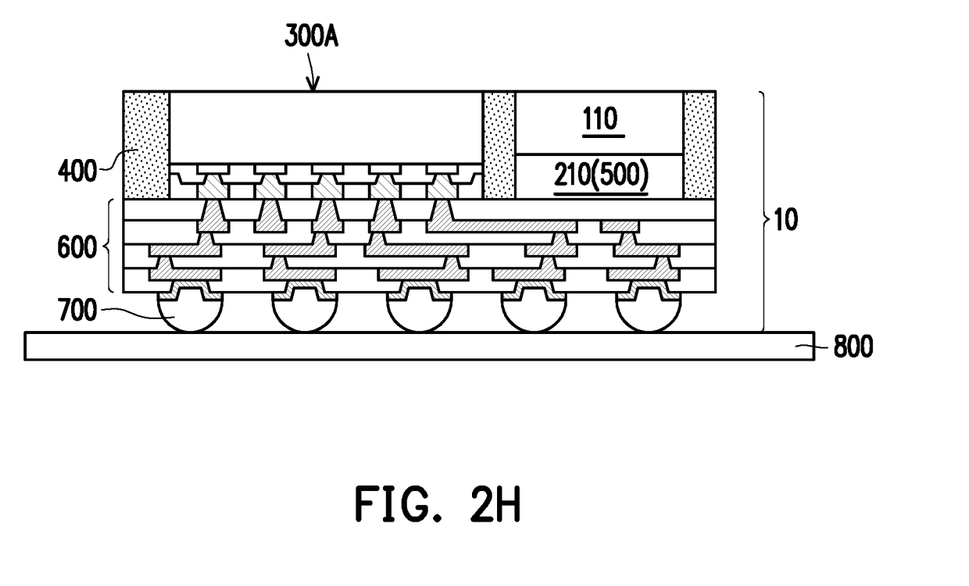
FIG. 2H shows a schematic cross-sectional view of a semiconductor package connected to a circuit substrate according to some embodiments of the present disclosure.

According to some embodiments, the semiconductor package 10 may be connected to a circuit substrate 800 such as a motherboard, a printed circuit board, or the like, as shown in FIG. 2H.

Figure 2I:
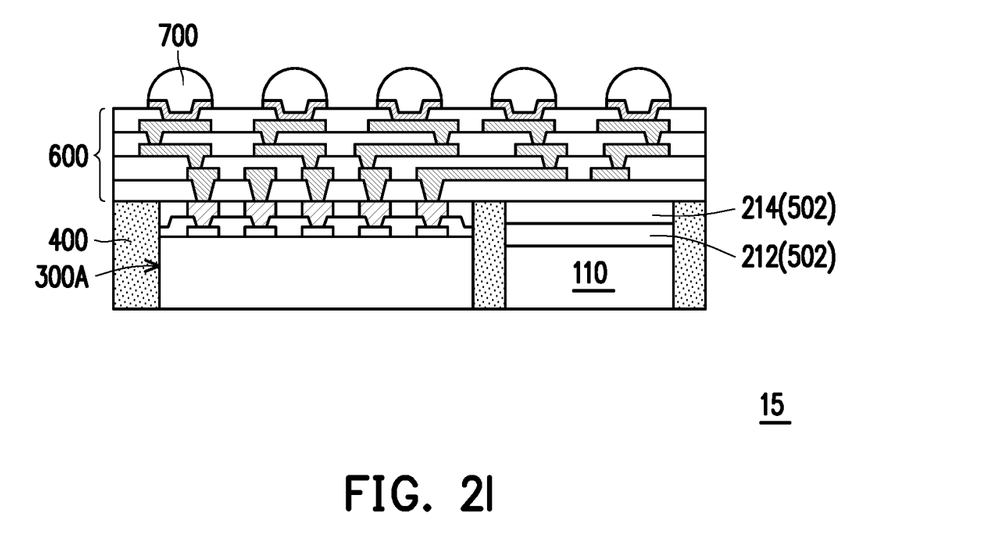
FIG. 2I shows a schematic cross-sectional view of a semiconductor package according to some embodiments of the present disclosure.

In FIG. 2I is shown a schematic cross-sectional view of a semiconductor package 15 according to some embodiments of the present disclosure. The semiconductor package 15 of FIG. 2I may contain similar components to the semiconductor package 10 of FIG. 2H, and the same or similar reference numerals are used to indicate analogous components between the two packages 10 and 15. The semiconductor package 15 differs from the semiconductor package 10 as a stress relaxation layer 502 comprises two polymeric layers 212 and 214 stacked on the dummy cube 110. The first polymeric layer 212 is disposed between the dummy cube 110 and the second polymeric layer 214, and the second polymeric layer 214 is disposed between the first polymeric layer 212 and the redistribution structure 600. Multiple polymeric layers 212, 214 may be fabricated on top of a dummy cube 110 following a similar process as described before with reference to FIG. 1A and FIG. 1B, for example by forming a second polymer material layer (not shown) on top of the first polymer material layer 200 (shown in FIG. 1A). In some embodiments, a material of the first polymeric layer 212 is different from a material of the second polymeric layer 214, but the disclosure is not limited thereto. In some embodiments, having multiple polymeric layers 212, 214 over the dummy cube 110 may provide more flexibility for balancing or matching properties such as coefficients of thermal expansion between different components of the semiconductor package 15. By including the stress relaxation layer 502 on top of the dummy cube 110, a failure rate of the semiconductor package 15 may be reduced, thus increasing the overall process yields and reducing the manufacturing cost per package.

Figure 4A:
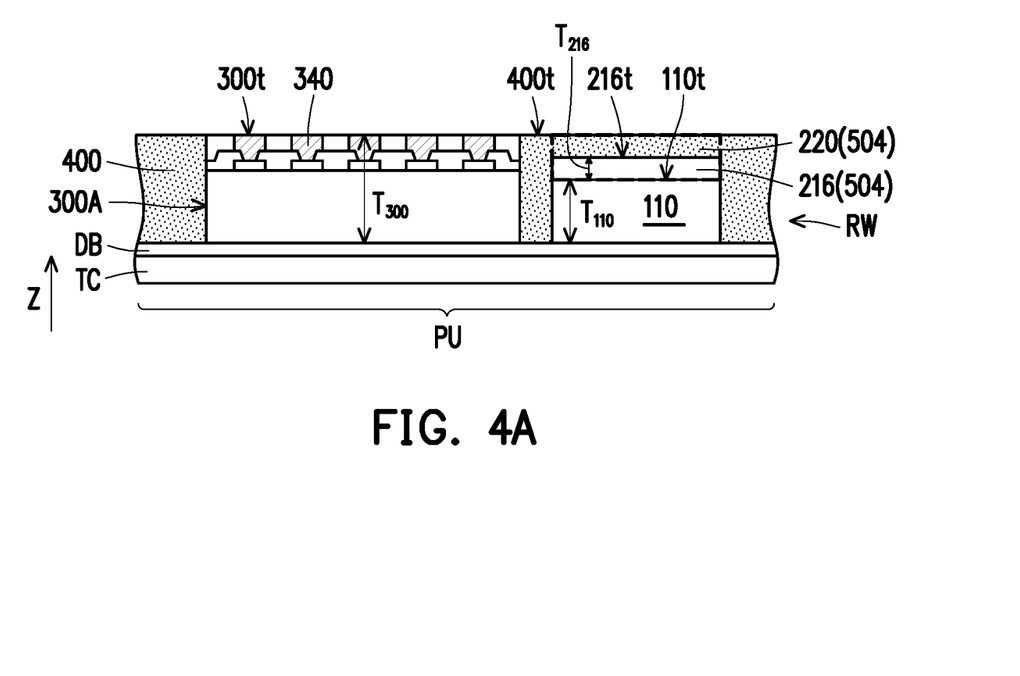
FIG. 4A through FIG. 4B show schematic cross-sectional views of structures produced at various stages of a manufacturing method of a semiconductor package according to some embodiments of the present disclosure.
Figure 4B:
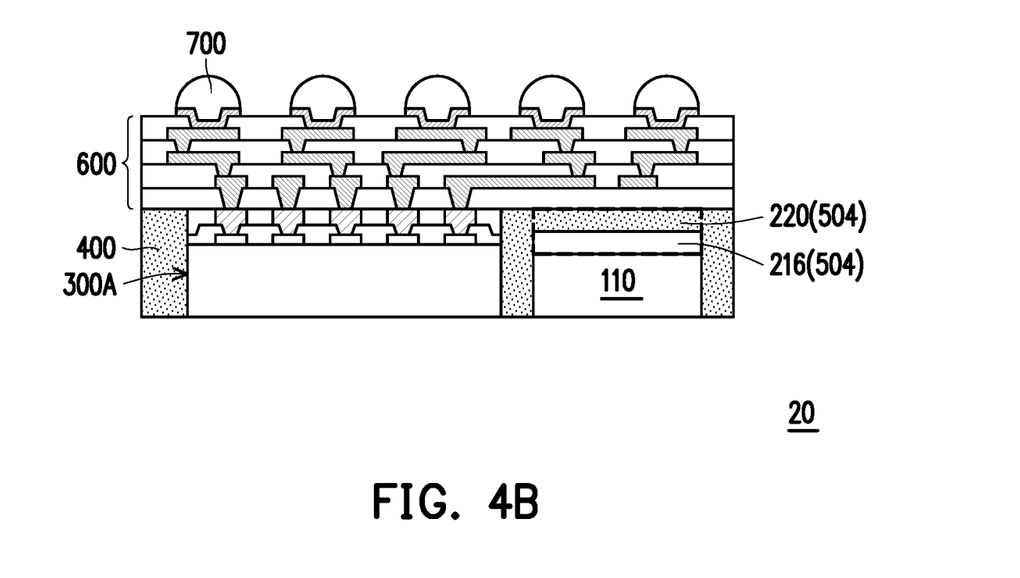
Figure 5:
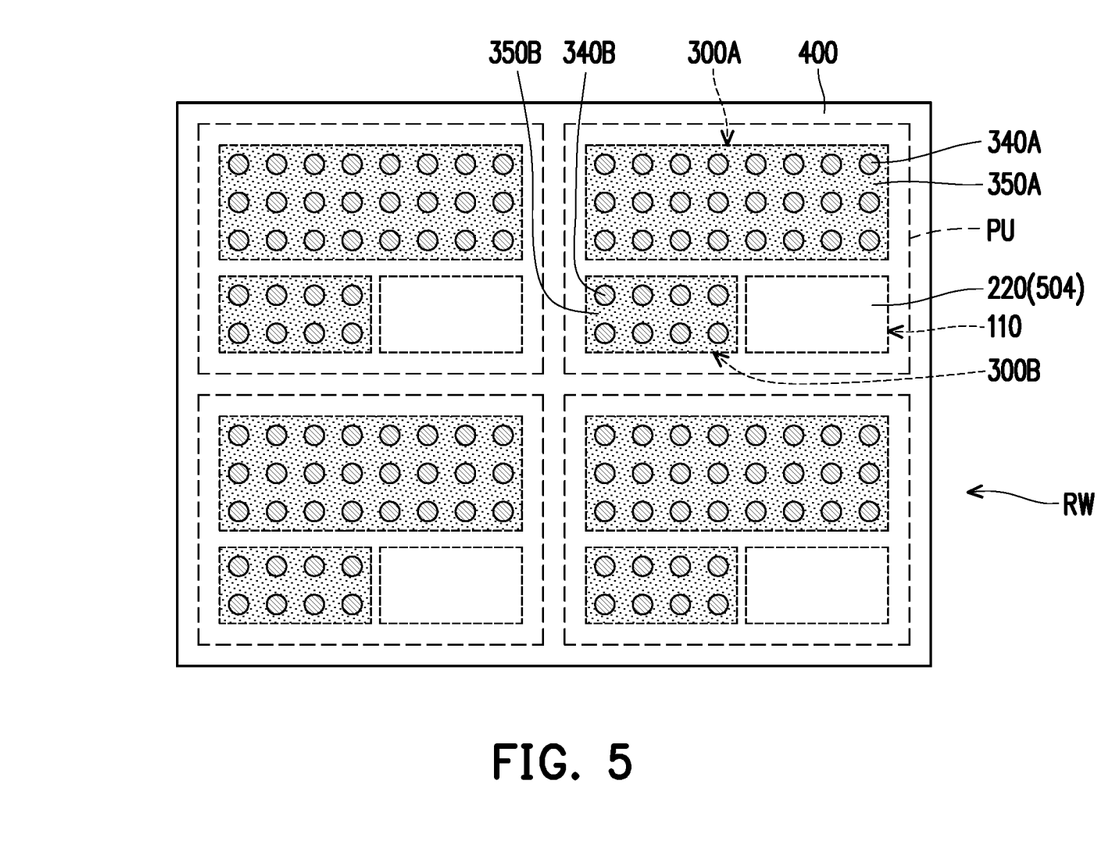
FIG. 5 shows a schematic top view of a manufacturing intermediate of semiconductor packages according to some embodiments of the present disclosure.

FIG. 4A through FIG. 4B show schematic cross-sectional views illustrating structures produced at various stages of a manufacturing method of a semiconductor package 20 shown in FIG. 4B. The manufacturing intermediate shown in FIG. 4A may be formed following similar steps as previously described with reference to FIG. 2A through FIG. 2D, and a detailed description thereof is omitted herein. Referring to FIG. 4A and FIG. 5, a package unit PU of the manufacturing intermediate of FIG. 4A includes one or more semiconductor dies and a dummy cube 110 having a polymeric layer 216 formed thereon. The semiconductor dies 300A, 300B, the dummy cube 110 and the polymeric layer 216 are encapsulated by an encapsulant 400. In some embodiments, multiple package units PU are formed in a reconstructed wafer RW. A difference between the structure shown in FIG. 4A and the corresponding structure shown in FIG. 2F is that the polymeric layer 216 is not exposed by the encapsulant 400. In some embodiments, a thickness $T_{300}$ of the dies 300A, 300B is greater than a combination of a thickness $T_{110}$ of the dummy cube 110 and a thickness $T_{216}$ of the polymeric layer 216. In other words, in the manufacturing intermediate of FIG. 4A, the polymeric layer 216 and a portion 220 of the encapsulant 400 extending over the polymeric layer 216 function together as a stress relaxation layer 504. Active surfaces 300t of the semiconductor dies 300A, 300B are coplanar with a top surface 400t of the encapsulant, and are raised with respect to a top surface 110t of the dummy cube 110 and a top surface 216t of the polymeric layer 212. As shown in FIG. 5, looking at the manufacturing intermediate of FIG. 4A from the top along a vertical direction Z (shown in FIG. 4A), only the active surfaces 300t of the two semiconductor dies 300A and 300B are exposed by the encapsulant 400, revealing the conductive posts 340A, 340B and the protective layers 350A, 350B. Where the dummy cube 110 is disposed, the polymeric layer 216 is buried underneath the portion 220 (the portion 220 is visible in FIG. 5) together with the dummy cube 110 further below. After forming the encapsulant 400, steps similar to the ones described with reference to FIG. 2E to FIG. 2G (production of a redistribution structure 600 and of connective terminals 700, package singulation and de-bonding of the temporary carrier TC) yield a plurality of semiconductor packages 20 (shown in FIG. 4B).

An exemplary cross-sectional view of the semiconductor package 20 according to some embodiments of the disclosure is illustrated in FIG. 4B. Based on the above, the semiconductor package 20 includes one or more semiconductor dies, the dummy cube 110, the polymeric layer 216, the encapsulant 400, the redistribution structure 600, and the connective terminals 700. The semiconductor dies 300A and 300B are electrically connected to the redistribution structure 600. The semiconductor dies 300A, 300B, the dummy cube 110 and the polymeric layer 216 are embedded in the encapsulant 400. In some embodiments, the polymeric layer 216 is disposed between the dummy cube 110 and the redistribution structure 600. In some embodiments, a portion 220 of the encapsulant 400 extends over the polymeric layer 216 and extends between the polymeric layer 216 and the redistribution structure 600. In some embodiments, connective terminals 700 are disposed on the redistribution structure 600 for electrically connecting the semiconductor package 20 with other electronic devices (not shown). In some embodiments, because the dummy cube 110 is embedded in the encapsulant 400, the semiconductor package 20 may have a lower tendency to undergo warpage or other deformation under thermal stress. Furthermore, the polymeric layer 216 and the portion 220 of encapsulant disposed thereon act as a stress relaxation layer 504. That is, as the encapsulating material 400a for forming the encapsulant 400 may be more effective in relieving the stress than the material of the dummy cube 110, the portion 220 together with the polymeric layer 216 function as the stress relaxation layer 504. In some embodiments, the stress relaxation layer 504 includes the polymeric layer 216 and the portion 220 of the encapsulant 400. Therefore, stress generated during a planarization process to form the encapsulant 400 is attenuated or relived more efficiently, so that cracking of the encapsulant 400 or delamination between the dummy cube 110 or the polymeric layer 216 and the encapsulant 400 are less likely to occur. In other words, by including the stress relaxation layer 504 on top of the dummy cube 110, a failure rate of the semiconductor package 20 may be reduced, thus increasing the overall process yields and reducing the manufacturing cost per package.

Figure 6A:
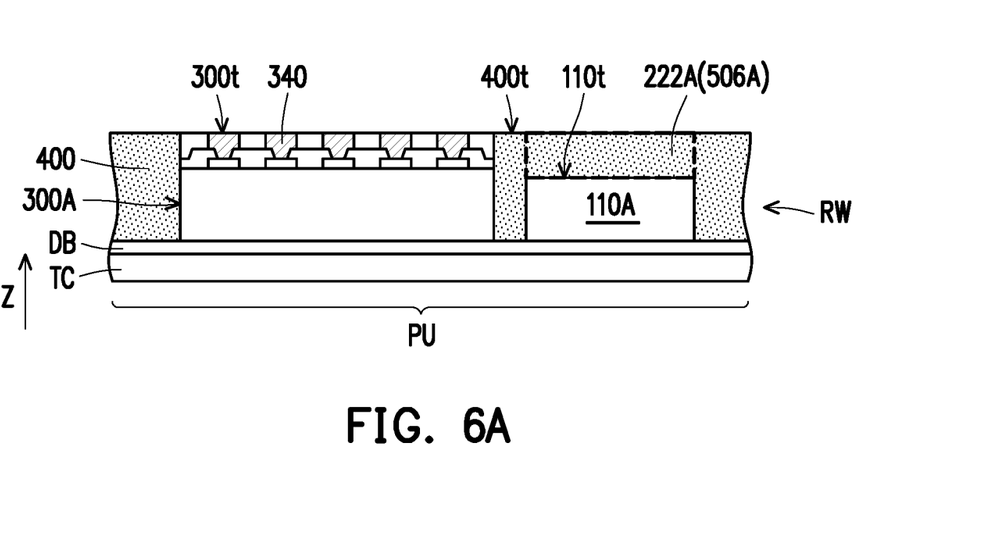
FIG. 6A through FIG. 6B show schematic cross-sectional views of structures produced at various stages of a manufacturing method of a semiconductor package according to some embodiments of the present disclosure.
Figure 6B:
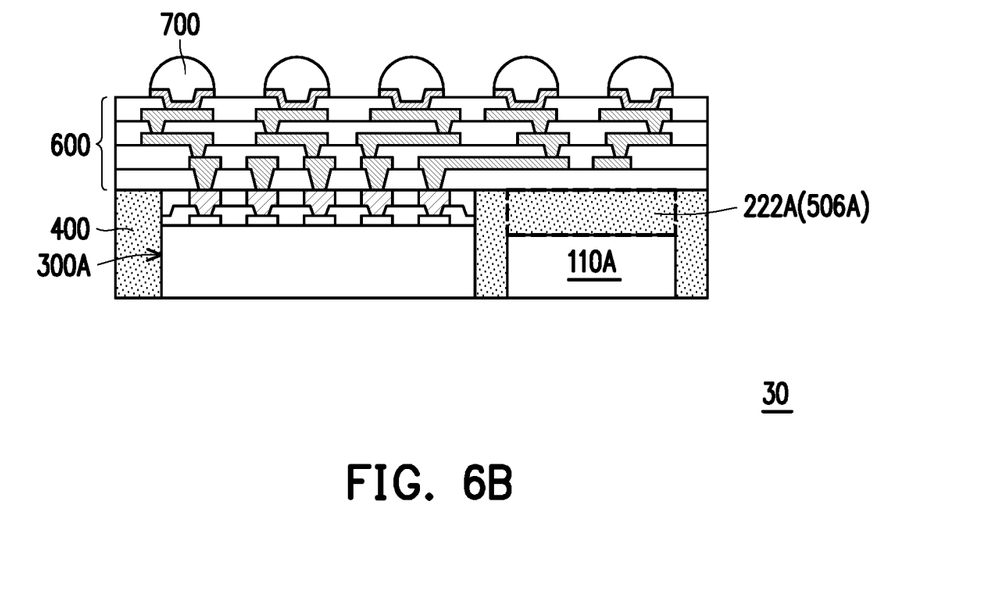
Figure 7:
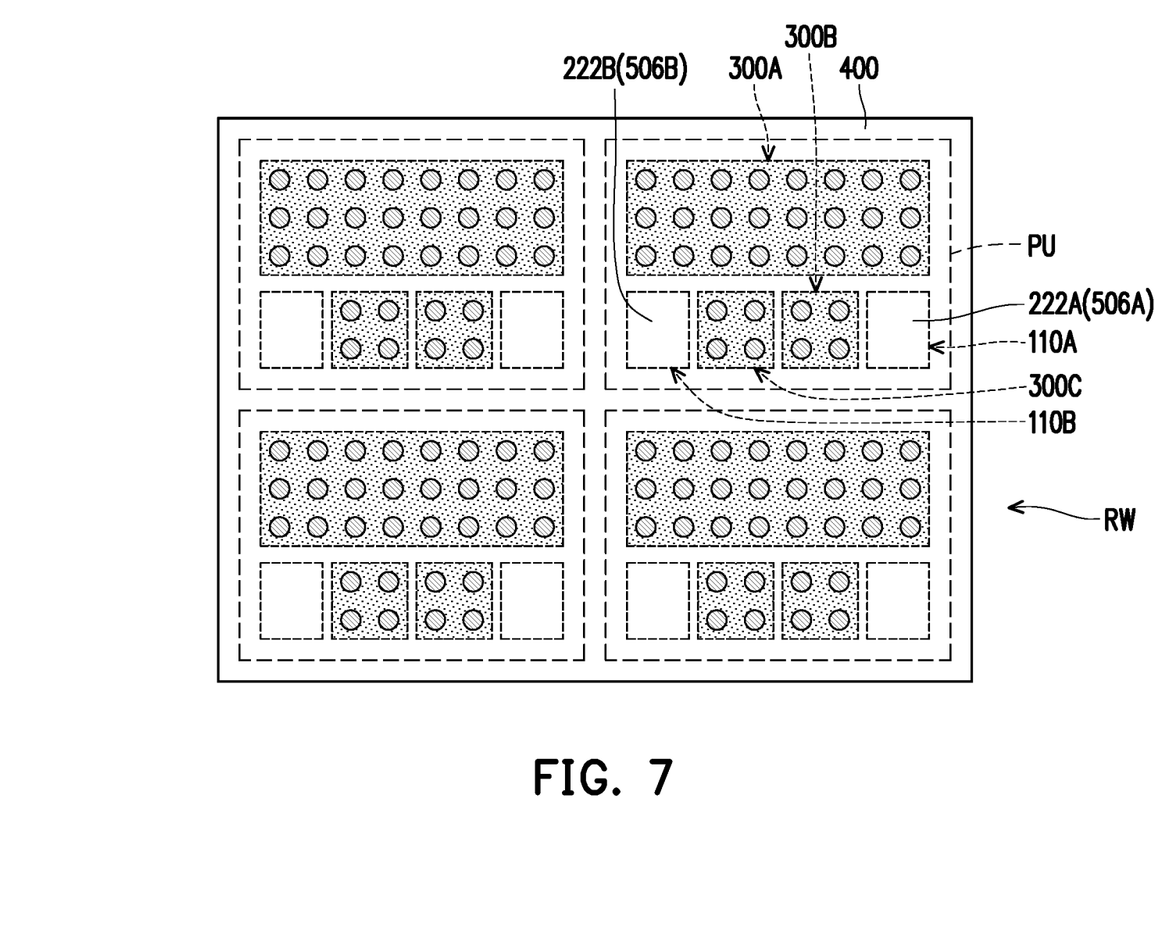
FIG. 7 shows a schematic top view of a manufacturing intermediate of semiconductor packages according to some embodiments of the present disclosure.

FIG. 6A through FIG. 6B show schematic cross-sectional views illustrating structures produced at various stages of a manufacturing method of a semiconductor package 30 shown in FIG. 6B. The manufacturing intermediate shown in FIG. 6A may be formed following similar steps as previously described with reference to FIG. 2D, and a detailed description thereof is omitted herein. Referring to FIG. 6A and FIG. 7, a package unit PU of the manufacturing intermediate of FIG. 6A includes one or more semiconductor dies, and one or more dummy cubes. The semiconductor dies 300A, 300B, 300C and the dummy cubes 110A, 110B are encapsulated by an encapsulant 400. In some embodiments, a size and a relative position of the semiconductor dies 300A, 300B, 300C may be such to leave multiple regions of a package unit PU filled by the sole encapsulant 400 were the dummy cubes 110A, 110B not included. For example, as shown in FIG. 7, the semiconductor die 300A may occupy almost an entire side of a package unit PU, whilst the other semiconductor dies 300B, 300C may leave multiple unoccupied regions, for example at opposite corners of the package unit PU. As such, the dummy cubes 110A, 110B may be disposed in the regions not occupied by the semiconductor dies 300A, 300B, 300C at the corners of the package unit PU. It should be noted that the number and relative positions of the semiconductor dies and the dummy cubes is not to be construed as a limitation of the present disclosure. In some alternative embodiments, more or fewer dummy cubes than two may be included, and may be disposed differently within the package unit PU than what is illustrated in FIG. 7. In some embodiments, multiple package units PU are formed in a reconstructed wafer RW. Another difference between the structures shown in FIG. 6A and FIG. 7 and the corresponding structures shown in FIG. 2D and FIG. 3 lies mainly in that portions 222A and 222B of the encapsulant 400 extend on top of the dummy cubes 110A and 110B, respectively. In other words, in the manufacturing intermediate of FIG. 6A and FIG. 7, each of the portions 222A and 222B of the encapsulant 400 extending over the corresponding dummy cube 110A or 110B functions as a stress relaxation layer 506A or 506B. That is, as the encapsulating material 400a for forming the encapsulant 400 may be more effective in relieving the stress than the material of the dummy cubes 110A and 110B, the portions 222A and 222B function as stress relaxation layers 506A and 506B, and the stress relaxation layers 506A and 506B are made of the encapsulating material 400a. As such, there may be no visible interface between the stress relaxation layers 506A and 506B and the encapsulant 400. As the stress relaxation layers 506A and 506B of the semiconductor package 30 do not include a polymeric layer, a manufacturing process may be simplified, and manufacturing costs may be reduced. In some alternative embodiments, one or both of the stress relaxation layers 506A and 506B may include a polymeric layer, as shown for the stress relaxation layers 500, 502 and 504 of FIG. 2G, FIG. 2I and FIG. 4B, respectively. In some embodiments, active surfaces 300t of the semiconductor dies 300A, 300B, 300C are coplanar with a top surface 400t of the encapsulant, and are raised with respect to top surfaces 110t of the dummy cubes 110A, 110B. As shown in FIG. 7, looking at the manufacturing intermediate of FIG. 6A from the top along a vertical direction Z (shown in FIG. 6A), only the active surfaces 300t of the semiconductor dies 300A, 300B, 300C are exposed by the encapsulant 400. Where the dummy cubes 110A, 110B are disposed, the dummy cubes 110A, 110B are buried underneath the portions 222A, 222B of the encapsulant 400. After forming the encapsulant 400, steps similar to the ones described with reference to FIG. 2E to FIG. 2G (production of a redistribution structure 600 and of connective terminals 700, singulation and de-bonding of the temporary carrier TC) yield a plurality of semiconductor packages 30 (shown in FIG. 6B).

An exemplary cross-sectional view of the semiconductor package 30 according to some embodiments of the disclosure is illustrated in FIG. 6B. Based on the above, the semiconductor package 30 includes the semiconductor dies 300A, 300B, 300C, the dummy cubes 110A, 110B, the encapsulant 400, the redistribution structure 600, and the connective terminals 700. The semiconductor dies 300A, 300B, 300C are electrically connected to the redistribution structure 600. The semiconductor dies 300A, 300B, 300C and the dummy cubes 110A, 110B are embedded in the encapsulant 400. In some embodiments, the portions 222A, 222B of the encapsulant 400 disposed between the dummy cubes 110A, 110B and the redistribution structure 600 act as stress relaxation layers 506A, 506B during a manufacturing process of the semiconductor package 30. In some embodiments, connective terminals 700 are disposed on the redistribution structure 600 for electrically connecting the semiconductor package 30 with other electronic devices (not shown). In some embodiments, because the dummy cubes 110A, 110B are embedded in the encapsulant 400, the semiconductor package 30 may have a lower tendency to undergo warpage or other deformation under thermal stress. Furthermore, as the portions 222A, 222B of encapsulant 400 disposed on the corresponding dummy cubes 110A, 110B act as stress relaxation layers 506A, 506B, stress generated during a planarization process to form the encapsulant 400 is relieved or distributed more efficiently, so that delamination between the dummy cubes 110A, 110B and the encapsulant 400 or cracking of the encapsulant 400 are less likely to occur. In other words, by including the stress relaxation layers 506A, 506B on top of the dummy cubes 110A, 110B, a failure rate of the semiconductor package 30 may be reduced, thus increasing the overall process yields and reducing the manufacturing cost per package.

In light of the present disclosure, when manufacturing a semiconductor package, the inclusion of a dummy cube within the encapsulant reduces the tendency of the package itself and manufacturing intermediates thereof to undergo deformation or warpage when exposed to heat stress. Furthermore, the inclusion of a stress relaxation layer on top of the dummy cube ensures that stress generated during a planarization process to form the encapsulant is attenuated or dispersed more efficiently, reducing or preventing a tendency of the dummy cube and the encapsulant to crack or delaminate. As such, inclusion of a dummy cube and a stress relaxation layer in a semiconductor package may reduce the failure rate of the package, increasing the overall process yield and reducing the unitary manufacturing cost.

In some embodiments of the present disclosure, a semiconductor package includes a die, a dummy cube, a stress relaxation layer, an encapsulant and a redistribution structure. The dummy cube is disposed beside the die. The stress relaxation layer covers a top surface of the dummy cube. The encapsulant encapsulates the die and the dummy cube. The redistribution structure is disposed over the encapsulant and is electrically connected to the die. The stress relaxation layer is interposed between the dummy cube and the redistribution structure.

In some embodiments of the present disclosure, a semiconductor package includes dies, a dummy cube, an encapsulant and a redistribution structure. The dies are disposed beside each other. The dummy cube is disposed beside the dies. The encapsulant encapsulates the dies and the dummy cube. The redistribution structure extends on a top surface of the encapsulant, and is electrically connected to the dies. A top surface of the encapsulant is coplanar with top surfaces of the dies, and is raised with respect to a top surface of the dummy cube.

In some embodiments of the present disclosure, a manufacturing method of a semiconductor package includes at least the following steps. A die is provided. A dummy cube having a polymeric layer formed thereon is provided and is disposed beside the die. The die, the polymeric layer and the dummy cube are encapsulated with an encapsulating material. The polymeric layer and the encapsulating material are planarized until an active surface of the die is exposed to form an encapsulant. A redistribution structure is formed on the planarized polymeric layer and the encapsulant.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor package, the method comprising:
    providing a die comprising conductive posts exposed at an active surface;
    providing a dummy cube having a polymeric layer formed thereon and disposing the dummy cube beside the die;
    encapsulating the die, the polymeric layer and the dummy cube with an encapsulating material;
    planarizing the polymeric layer and the encapsulating material until the active surface of the die is exposed to form an encapsulant, wherein planarizing the polymeric layer and the encapsulating material comprises performing a planarization process to partially remove the polymeric layer and the encapsulating material to expose the active surface of the die without exposing a top surface of the dummy cube, and a top surface of the encapsulant is coplanar with the active surface of the die and a top surface of the planarized polymeric layer; and
    forming a redistribution structure on the planarized polymeric layer and the encapsulant.

2. The method of claim 1, wherein the redistribution structure is electrically connected to the die and electrically isolated from the dummy cube.

3. The method of claim 1, wherein providing the dummy cube comprises:
    providing a wafer comprising a first material;
    forming a polymer material layer on a surface of the wafer; and
    dicing the wafer to form the dummy cube having the polymeric layer formed thereon.

4. The method of claim 3, wherein the wafer is diced to form a plurality of dummy cubes.

5. The method of claim 3, wherein the first material is a semiconductor material of the groups III-V of the Periodic Table.

6. The method of claim 3, wherein the first material is an inorganic material.

7. The method of claim 3, wherein forming the polymer material layer on the surface of the wafer comprises spin coating a polymeric material on the surface of the wafer.

8. The method of claim 3, wherein forming the polymer material layer comprises stacking polymeric layers including different materials on the surface of the wafer.

9. A manufacturing method of a semiconductor package, the method comprising:
    disposing a die on a carrier, wherein the die has conductive posts located at a top surface of the die;
    disposing a dummy cube on the carrier beside the die, wherein a polymeric layer is on a surface of the dummy cube, the dummy cube is disposed on the carrier so as to be interposed between the carrier and the polymeric layer, and a top surface of the polymeric layer is further away from the carrier than the top surface of the die;
    covering the die, the dummy cube, and the polymeric layer with an encapsulating material; and
    planarizing the encapsulating material until the contact posts at the top surface of the die are exposed,
    wherein, after planarization of the encapsulating material, the top surface of the polymeric layer is coplanar with the top surface of the die.

10. The manufacturing method of claim 9, further comprising:
    forming a redistribution structure on the top surface of the polymeric layer and the top surface of the die.

11. The manufacturing method of claim 9, wherein planarizing the encapsulating material comprises performing a mechanical grinding process, a chemical mechanical polishing process, or a combination thereof.

12. The manufacturing method of claim 9, wherein a portion of the polymeric layer is removed during planarization of the encapsulating material.

13. The manufacturing method of claim 9, wherein the polymeric layer includes polyimide, polybenzooxazole, or a combination thereof.

14. The manufacturing method of claim 9, wherein the encapsulating material is provided by a compression molding process.

15. A manufacturing method of a semiconductor package, the method comprising:
    placing a die on a carrier, wherein the die has a rear surface and an opposite front surface, the die is placed with the rear surface closer to the carrier, and a first thickness of the die is measured as a distance from the rear surface to the front surface;
    placing a dummy cube on the carrier beside the die, wherein the dummy cube has a polymeric layer formed on a first surface, the dummy cube is placed on the carrier with a second surface closer to the carrier, the second surface being opposite to the first surface, a second thickness which is a combined thickness of the dummy cube and the polymeric layer is greater than the first thickness, and the second thickness and the first thickness are measured along a same direction; and
    forming an encapsulant surrounding the die, the dummy cube, and the polymeric layer,
    wherein, during formation of the encapsulant, the second thickness is reduced to a third thickness smaller than the second thickness.

16. The manufacturing method of claim 15, further comprising:
    forming alternately stacked dielectric layers and redistribution conductive layers on the die and the dummy cube after formation of the encapsulant, wherein the redistribution conductive layers are electrically connected to the die.

17. The manufacturing method of claim 15, wherein the second thickness includes a fourth thickness of the dummy cube, the fourth thickness is measured from the first surface of the dummy cube to the second surface of the dummy cube, and the fourth thickness is smaller than the first thickness of the die.

18. The manufacturing method of claim 17, wherein the fourth thickness of the dummy cube is the same before and after the formation of the encapsulant.

19. The manufacturing method of claim 15, wherein the rear surface of the die and the second surface of the dummy cube are coplanar.

20. The manufacturing method of claim 15, wherein the second thickness includes a fifth thickness of the polymeric layer, the fifth thickness of the polymeric layer is measured from a first surface of the polymeric layer in contact with the first surface of the dummy cube to a second surface of the polymeric layer opposite to the first surface, and the fifth thickness is reduced to a sixth thickness smaller than the fifth thickness during formation of the encapsulant.

* * * * *